United States Patent
Yanagisawa et al.

[11] Patent Number: 6,048,396
[45] Date of Patent: Apr. 11, 2000

[54] METHOD FOR PRODUCING CALCITE-TYPE CALCIUM CARBONATE SINGLE CRYSTAL

[75] Inventors: Kazumichi Yanagisawa; Isao Matsushita, both of Kochi, Japan

[73] Assignee: Toyo Denka Kogyo Co., Ltd., Kochi-ken, Japan

[21] Appl. No.: 08/886,126

[22] Filed: Jul. 3, 1997

[30] Foreign Application Priority Data

Mar. 14, 1997 [JP] Japan ................................ 9-082315

[51] Int. Cl.[7] ............................................. C30B 7/10
[52] U.S. Cl. ........................ 117/71; 117/72; 117/944
[58] Field of Search ............................ 117/71, 72, 944

[56] References Cited

U.S. PATENT DOCUMENTS

| | | | |
|---|---|---|---|
| 4,685,995 | 8/1987 | Hirano | 117/71 |
| 4,762,588 | 8/1988 | Hirano et al. | 117/71 |
| 4,961,823 | 10/1990 | Hirano et al. | 117/71 |
| 5,069,744 | 12/1991 | Borodin et al. | 117/71 |

FOREIGN PATENT DOCUMENTS

| | | |
|---|---|---|
| 61-215295 | 9/1986 | Japan . |
| 62-113798 | 5/1987 | Japan . |
| 63-230593 | 9/1988 | Japan . |
| 64-28298 | 1/1989 | Japan . |
| 6-316493 | 11/1994 | Japan . |

OTHER PUBLICATIONS

Yanagisawa et al., "Hydrothermal single crystal growth of calcite in ammonium acetate solution", Journal of Crystal Growth vol. 163 No. 3 pp. 285–294, Jun. 1996.
H.J. Nickl and H.K. Henisch, J. Electroche. Soc. 116, 1258–1260 (1969).
J.F. Nester and J.B. Schroeder, Am. Mineralogist 52, 276–280 (1967).
S. Hirano and K. Kikuta, Bull. Chem. Soc. Jpn. 60 1109–1112 (1987).
N. Yu. Ikornikova, Growth of Crystals 3, 297–301 (1962).
S. Hirano and K. Kikuta, J. Cryst. Growth 94, 351–356 (1989).
S. Hirano, T. Yogo, K. Kikuta and Y. Yoneta, J. Ceram. Soc. Jpn 101 113–117 (1993).
D.R. Kinloch, R.F. Belt and R.C. Puttbach, J. Cryst. Growth 24/25, 610–613 (1974).
Brief of Lecture in 37th Artificial Crystal Debate, p. 53.
M. Higuchi, A. Takeuchi and K. Kodaira, J. Cryst. Growth 92, 341–343 (1988).

*Primary Examiner*—Robert Kunemund
*Attorney, Agent, or Firm*—Shlesinger Arkwright & Garvey

[57] ABSTRACT

This invention provides a method for producing calcite-type calcium carbonate single crystal available for optical elements, which can be carried out under relatively low temperature and low pressure conditions. The crystal growth process which comprises; a first step of filling a sealed pressure container of an autoclave with solvent and calcium carbonate as a raw material for growth, a second step of dissolving the starting rate in the solvent under predetermined conditions of pressure and temperature, a third step of crystallizing the calcium carbonate on a seed crystal suspended in the upper portion of the pressure container, on account of the difference of solubility caused by temperature gradient in the container; the method is characterized by that the aqueous solution of ammonium salt of mono-carboxylic acid is used as the solvent. The ammonium salt of mono-carboxylic acid is selected from the ammonium salts of carboxylic acid of whose alkyl group has 1 to 6 carbons, such as ammonium salts of acetic acid, propionic acid, butyric acid, valeric acid, hexanoic acid (equal to caproic acid), and heputanic acid (equal to enantic acid).

4 Claims, 1 Drawing Sheet

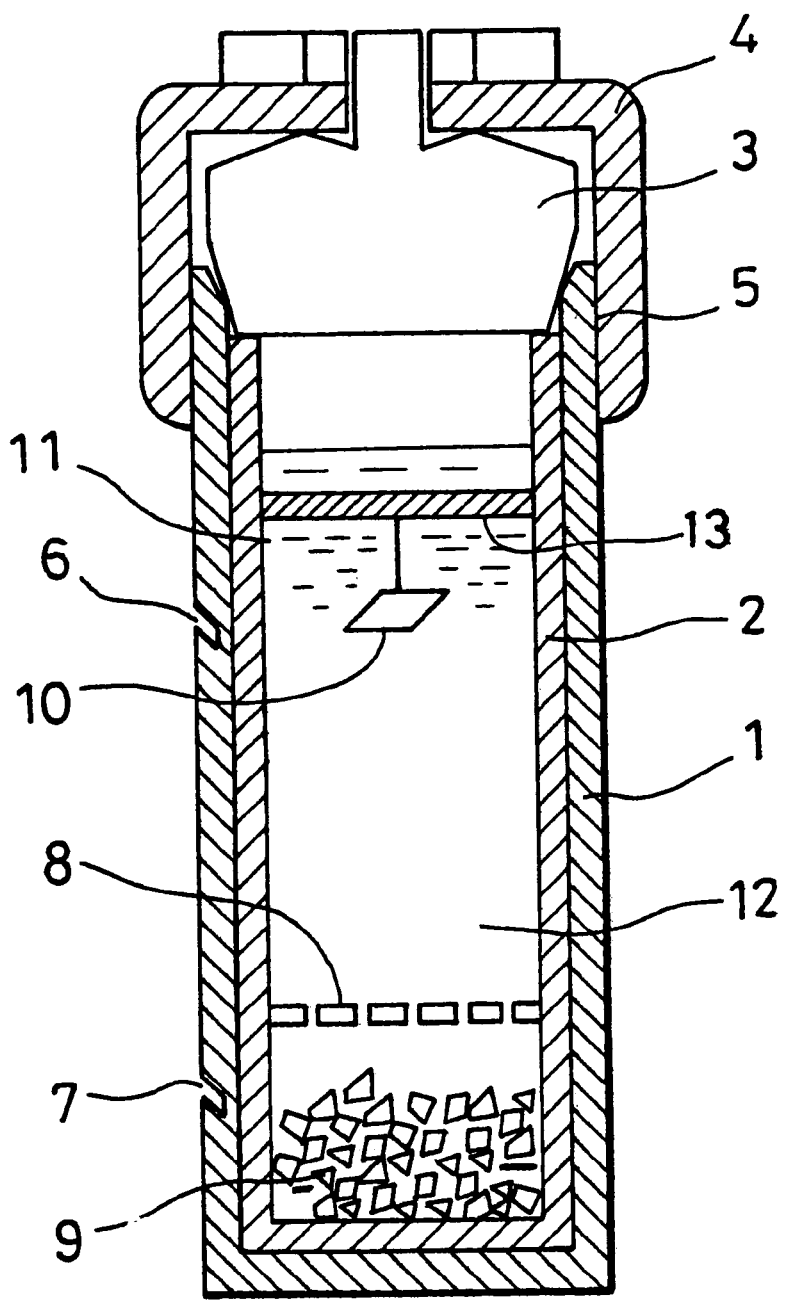

METHOD FOR PRODUCING CALCITE-TYPE CALCIUM CARBONATE SINGLE CRYSTAL

BACKGROUND OF THE INVENTION

1. Field of the Invention

The present invention generally relates to a method for producing calcite-type calcium carbonate single crystal which can be advantageously used for various optical elements such as an optical polarizer, or the like. More particularly, the present invention relates to a method for producing a calcite-type calcium carbonate single crystal on an industrial scale by a typical hydrothermal synthesis method in which the aqueous solution of ammonium salt of mono-carboxylic acid is used as a solvent for the raw material to grow the single crystal on seed crystal under predetermined conditions such as the concentration and pH value of the solvent.

2. Description of the Prior Art

It is well known that a single crystal of calcium carbonate ($CaCO_3$) commonly used as an optical element belongs to a calcite type structure according to a crystallographic view. Such calcite type crystals belong to a trigonal system and are in a thermodynamic stable phase of calcium carbonate under normal ambient temperature and pressure conditions. Since the calcite type crystals have inherently a high index of double refraction, their single crystals have been broadly applied to various optical devices.

As is understood by one skilled in this art, the above described phenomenon "double refraction" represents two different refractive beams which are generated to correspond to one incident beam through a single crystal. Particularly, the calcite type single crystals have been used as a polarizer prism for various optical devices owing to their high index of double refraction. As various devices of optics such as of laser optics, and of optical communication have been rapidly progressing and commonly being used in a widely enlarged market, materials for these optical elements having excellent optical properties have become to be required. Since the calcite type single crystals are known as an optically ideal material, it is easily anticipated that these materials will be greatly demanded within recent years.

As is well known, calcite is distributed as "limestone" in natural form throughout the world. Also in Japan, a great deal of "limestone" is produced. However, a relatively large size single crystal of calcite applicable to optical elements is rare and naturally produced in only Mexico and Brazil. Especially, the calcite type single crystal having a large size and a high quality tends to be less available.

Although many attempts to artificially grow the calcite single crystal having excellent optical properties have been conventionally carried out, none of these attempts have resulted in success. It is understood by skilled artisans that the conditions for useful artificially grown calcite-type calcium carbonate single crystal are to be possessed of properties such as the same index of double refraction as well as natural calcite; colorless and transparent to easily penetrate light in UV, visible light, and IR ranges; nonexistence of impurities, cracks, twin crystal and strains.

Calcite is decomposed at about 900° C. under atmospheric pressure, so that it is impossible to directly form it from its melt. Conventional synthesis methods to produce calcite-type calcium carbonate single crystal have been known as the Gel Method (referring to H. J. Nickl and H. K. Henisch, J.Electroche.Soc. 116, 1258–1260, 1969), Flux Method (referring to J. F. Nester and J. B. Schroeder, Am.Mineralogist 52, 276–280, 1967), and Hydrothermal Method. However, Gel Method can not produce calcite-type calcium carbonate single crystal having a size large enough for optical elements. In the Flux Method, the resulted calcite single crystal tends to be mixed with impurities such as lithium which is caused by lithium carbonate used as the flux agent and thermally generated strain owing to a high temperature process. On the other hand, it has been known by one skilled in the art that the Hydrothermal Method is advantageous to produce a single crystal of a high degree of purity when the single crystal is not directly formed from its melted material by another method. Practically, an artificial single crystal of quartz has been industrially manufactured by this Hydrothermal Method.

The principle and process of this Hydrothermal Method will be briefly described.

First of all, a pressure container of an autoclave is filled with solvent. A seed crystal is disposed in the upper portion of the autoclave. A raw material for crystal growth is disposed in the lower portion of the autoclave. The temperature of the seed crystal portion is set slightly lower than that of the raw material portion when the temperature coefficient of the solubility of the raw material in the solvent is positive. The raw material at a higher temperature is dissolved into the solvent. The dissolved ions are moved upwards to the seed crystal portion by thermal convection owing to temperature gradient. The ion species arrive at the near area of the seed crystal portion and then are deposited on the surface of the seed crystal because the temperature of the seed crystal portion is lower than that of the raw material portion. Thus the seed crystal gradually grows up.

The solvent to be used can be selected from various inorganic aqueous solutions for increasing the solubility of the raw material. The growth rate of the crystal and the quality of the grown layer depend on the temperature of the seed crystal portion, the temperature difference between the seed crystal portion and the raw material portion, the type of solvent, and the concentration of the solvent.

Typical examples of the solvent used for growth of calcite-type single crystal by Hydrothermal Method are as follows. Aqueous solution of NaCl is disclosed in S. Hirano and K. Kikuta, Bull.Chem.Soc.Jpn. 1109–1112, 1987; and N. Yu. Ikornikova, Growth of Crystals, 3, 297–301, 1962. Aqueous solution of LiCl is disclosed in N. Yu. Ikornikova, Growth of Crystals, 3, 297–301, 1962. Aqueous solution of $CaCl_2$ is disclosed in N. Yu. Ikornikova, Growth of Crystals, 3, 297–301, 1962. Aqueous solution of $NaNO_3$ is disclosed in N. Yu. Ikornikova, Growth of Crystals, 3, 297–301, 1962. Aqueous solution of $Ca(NO_3)_2$ is disclosed in S. Hirano and K. Kikuta, J.Cryst.Growth 94, 351–356, 1989; and S. Hirano, T. Yogo, K. Kikuta and Y. Yoneta, J.Ceram.Soc.Jpn. 101, 113–117, 1993. Aqueous solution of $NH_4NO_3$ is disclosed in S. Hirano, T. Yogo, K. Kikuta and Y. Yoneta, J.Ceram.Soc.Jpn. 101, 113–117, 1993. Aqueous solution of $K_2CO_3$ is disclosed in D. R. Kinloch, R. F. Belt and R. C. Puttbach, J.Cryst.Growth 24/25, 610–613, 1974. Aqueous solution of $NH_4Cl$ is disclosed in N. Yu. Ikornikova, Growth of Crystals, 3, 297–301, 1962; and Brief of Lecture in 37th Artificial Crystal Debate, p53. Aqueous solution of carbonic acid is disclosed in M. Higuchi, A. Takeuchi and K. Kodaira, J.Cryst. Growth 92, 341–343, 1988.

Conventional methods for producing calcite-type calcium carbonate single crystal by the above described hydrothermal synthesis method are disclosed in, for example, Japanese Patent Laid-open Publication No. 61-215295/1986 entitled "Method of Growth in Chloride Aqueous Solution", Japanese Patent Laid-open Publication No. 62-113798/1987 entitled "Method of Growth in Nitrate Aqueous Solution", Japanese Patent Laid-open Publication No. 63-230593/1988 entitled "Method of Growth in Aqueous Solution of Calcium Nitrate", and Japanese Patent Laid-open Publication No. 64-28298/1989 entitled "Method of Growth in Aqueous Solution of Ammonium Nitrate".

The inventor of the present application has previously proposed a producing method of calcium carbonate single crystal by hydrothermal method using organic ammonium salt as solvent for growing the crystal, as Japanese Patent Laid-open Publication No. 6-316493/1994. According to this method, it was possible to grow calcite-type calcium carbonate single crystal with high growth rate under relatively low temperature and low pressure conditions in comparison with the conventional methods using inorganic salt aqueous solution as solvent. This resulted in grown layer with a high quality.

A naturally produced calcite-type single crystal, applicable for optical device should possess properties such as: colorlessness and transparence, nonexistence of: bubbles, cracks, twin crystal or strains, and relatively large, as optimum size. However, the single crystal satisfying these properties is rare and naturally produced in only the Republic of South Africa, Mexico and Brazil. Especially, the calcite type single crystal of large and high quality tends to be less than the industrial demand can satisfy.

In order to substitute for naturally produced calcite, many artisans unwillingly use the artificial calcite-type calcium carbonate single crystal produced by the hydrothermal synthesis method. But, as described above, conventional methods, using aqueous solution of inorganic salt as solvent, for growing calcite-type calcium carbonate single crystal are inferior with respect to the reason that the growth speed of the crystal is inherently slow, and when the concentration of the solvent and the temperature difference between the crystal growing portion and the raw material solving portion are increased to accelerate the crystal growth speed, the grown layer will contain the defects which are not useable for optical elements, or secondary crystals will occur. Further, if the temperature and pressure for crystal growth are increased to accelerate the crystal growth speed, a specially designed container withstanding high pressure and high temperature will be required. This will result in a rising cost to produce calcite-type calcium carbonate single crystal on an industrial scale. Consequently, the conventional method using inorganic salt type solvent is not available for the mass production of calcite-type calcium carbonate single crystal having such a high quality and large size for optical elements at a relatively low cost.

BRIEF SUMMARY OF THE INVENTION

It is, therefore, an object of the present invention to provide an improved method for producing calcite-type calcium carbonate single crystal which overcomes the above described conventional problems.

Another object of the present invention is to provide an improved method for producing calcite-type calcium carbonate single crystal which can be carried out under relatively low temperature and low pressure conditions.

An additional object of the present invention is to provide an improved method for producing calcite-type calcium carbonate single crystal which is available for mass-production on an industrial scale.

To accomplish the above described objects, an improved method for producing calcite-type calcium carbonate single crystal is based on a crystal growth process which comprises: a first step for filling a sealed pressure container of an autoclave with solvent and calcium carbonate as a raw material for crystal growth, a second step for dissolving the raw material to the solvent under predetermined conditions of pressure and temperature, and a third step for crystallizing the calcium carbonate on a seed crystal suspended in the upper portion of the pressure container on account of the difference in solubility caused by temperature gradient in the container. The improved method according to the present invention is characterized by that the aqueous solution of ammonium salts of mono-carboxylic acid are used as the solvent of the above crystal growth process.

The ammonium salt of mono-carboxylic acid preferably used in the present invention may be selected from the ammonium salts of carboxylic acid with alkyl group of 1 to 6 carbons, such as ammonium salts of acetic acid containing an alkyl group having one carbon, propionic acid containing an alkyl group having two carbons, butyric acid containing an alkyl group having three carbons, valeric acid containing an alkyl group having four carbons, hexanoic acid (equal to caproic acid) containing an alkyl group having five carbons, and heputanic acid (equal to enantic acid) containing an alkyl group having six carbons.

The concentration of the above described solvent is preferably selected from 0.01 to 1 mole/liter, and the pH value of the solvent is preferably prepared within the range between 7.0 and 10.5.

According to the method for producing calcite-type calcium carbonate single crystal proposed by the present invention, the raw material for growth; i.e., calcium carbonate, is set in the pressure container, and then the pressure container is filled with the aqueous solution of ammonium salt of mono-carboxylic acid as a solvent. This pressure container is maintained under sealed, high temperature and high pressure conditions so that the raw material is dissolved in the aqueous solution of ammonium salt of mono-carboxylic acid. The dissolved material is moved upwards, and succeedingly crystallized on the calcite seed crystal on account of the difference of solubility caused by the temperature gradient in the container. As a result, the calcite-type calcium carbonate single crystal having the same crystal structure as the seed crystal is grown.

Since the method of the present invention is not only limited to such high temperature and pressure conditions, it is also possible to grow the calcite-type calcium carbonate single crystal under relatively low temperature and pressure conditions. This may reduce manufacturing cost required to build and run the growth apparatus. In other words, the method according to the present invention is advantageously applied to the manufacturing system on an industrial scale.

Other objects and advantages of the invention will become apparent during the following discussion of the accompanying drawing.

BRIEF DESCRIPTION OF THE DRAWING

FIG. 1 is a sectional view showing the essential portion of an apparatus for embodying the method for producing calcite-type calcium carbonate single crystal according to the present invention.

DETAILED DESCRIPTION OF THE PREFERRED EMBODIMENT

The present invention will be understood by discussing the preferred embodiment of the method for producing calcite-type calcium carbonate single crystal according to the present invention. Referring to FIG. 1, there is sectionally shown an example of a typical apparatus for crystal growth, which has been known as a cone-in-cone type autoclave. In the drawing, this autoclave comprises a pressure container 1 in which an inner vessel 2 made of Teflon (trade name) or titanium is set. This autoclave further includes a cone-shape weight member 3 securingly fit to the upper opening end of the pressure container 1, and a cover member 4 for covering over the cone-shape weight member 3. The cover member 4 is threadingly engaged with a threaded portion 5 of the pressure container 1. As the cover member 4 is threaded down, the corn-shape weight member 3 is forcedly brought in contact with the upper opening end of the pressure container 1 to keep the interior of the pressure container 1 under sealed condition. In the external wall surface of the pressure container 1, an upper temperature measuring hole 6 and a lower temperature measuring hole 7 are formed in such manner that a sensor (not shown) such as a thermocouple is set in each hole to monitor the temperature of the upper or lower portion of the pressure container 1. The pressure container 1 further includes a buffer plate 8 and solvent 12 which is filled in the inner tubular member 2.

This embodiment uses ammonium salt of mono-carboxylic acid as the solvent 12, and either Teflon made inner vessel 2 when the inner temperature of the pressure container 1 is lower than 250° C., or titanium made inner tubular member 2 when the temperature is 250° C. or higher. In order to grow calcium carbonate single crystal, raw material 9, which supplies calcium carbonate single crystal, is deposited into the inner bottom of pressure container 1. Raw material 9 can be calcium carbonate of high purity chemical agent which is commercially available, or high purity limestone in 1 to 5 mm particles.

In the upper portion of the pressure container 1, a seed crystal 10 consisting of naturally produced calcite single crystal is suspended from an inner rid 13 of the inner tubular member 2 through a platinum wire 11. The buffer plate 8 is arranged to control the thermal convection of the solvent 12, and its opening ratio is selected in the range of 5 to 10%. The concentration of the solvent 12 is selected from the range between 0.01 and 1.0 mole. The pH value of the solvent is previously adjusted to the range between 7.0 and 10.5 by adding aqueous ammonia prior to contact between the seed crystal and the raw material.

For the seed crystal 10, naturally produced calcite single crystal or a cut piece of the single crystal produced by this embodiment may be also used.

In the case that hydrothermal growth is carried out under saturated vapor pressure, the filling ratio of the solvent 12 depends on the temperature in the growth area (the upper portion). This pressure container 1 is set in an electric furnace (with temperature gradient) to keep the temperature gradient in such that the temperature of the upper portion of the pressure container 1 has a lower predetermined value than that of the lower portion under monitoring by the sensors. The pressure container 1 is continuously heated with keeping this temperature gradient. It is required to keep the temperature of the growth area lower than that of the starting material area by controlling heating the individual electric furnace corresponding to the two sensors set in the upper and lower temperature measuring holes 6 and 7 formed in the external wall of the autoclave.

Under the above described hydrothermal conditions, that is: sealed high pressure and high temperature, the raw material 9 dissolved into the solvent 12, aqueous solution of ammonium salt of mono-carboxylic acid, and the solved material is moved upwards owing to the thermal convection caused by the temperature gradient and the difference between the solubility of the upper portion and that of the lower portion. As a result, the dissolved material is succeedingly crystallized over the seed crystal 10 in the lower temperature area. Thus the growth layer of the crystal having the same crystal structure as the seed crystal 10 is formed.

After a predetermined time has been passed, the electric furnace is turned off and the pressure container 1 is gradually cooled down in ambient air. The cooled cover member 4 and corn-shape weight 3 are removed to pick up the seed crystal 10 with the grown crystal layer. This is the end of one reaction process.

According to experiments in which various organic ammonium salts were used as the solvent 12 of the above described process, it was confirmed that the aqueous solution of ammonium salt of mono-carboxylic acid was superior to the remaining organic ammonium salts with respect to growth of calcite type single crystal. The ammonium salt of mono-carboxylic acid is required to be water soluble and durable to thermal decomposition under the hydrothermal conditions.

In the present invention, a preferable ammonium salt of mono-carboxylic acid is selected from aliphatic compounds having relatively low carbon number and without unsaturated bonding. In detail, such the preferable ammonium salt of mono-carboxylic acid is defined by the carboxylic acids having the chemical structure $RCOONH_4$, wherein R represents an alkyl group with 1 to 6 carbons, such as acetic acid containing an alkyl group having one carbon, propionic acid containing an alkyl group having two carbons, butyric acid containing an alkyl group having three carbons, valeric acid containing an alkyl group having four carbons, hexanoic acid (equal to caproic acid) containing an alkyl group having five carbons, and heputanic acid (equal to enantic acid) containing an alkyl group having six carbons. It is not preferable to use ammonium formate as a solvent when the growth process is carried out at 200° C. or higher because ammonium formate will be decomposed at that temperature range.

The experimental data indicates that the above defined ammonium salts of mono-carboxylic acid having alkyl group with 1 to 6 carbons are superior to conventional inorganic salts with respect to quality of crystal and growth rate. Among of these ammonium salts, the ammonium salts of propionic acid containing alkyl group having two carbons and butyric acid containing an alkyl group having three carbons are preferable.

It is preferable to prepare the concentration of the solvent of this process between 0.01 and 1 mole/liter. When it is less than 0.01 mole/liter, the solvent is too weak to dissolve the raw material enough, thereby slowing the growth rate. On the other hand, when it is greater than 1 mole/liter, the growth rate becomes faster but the quality of calcite type single crystal grown is too poor to use as an optical element.

It is preferable to prepare the pH value of the solvent of this process between 7.0 and 10.5 by using aqueous ammonia. When it is less than 7.0, the growth speed of calcite type single crystal becomes remarkably lower than the industrially appropriate available level. On the other hand, when it is greater than 10.5, the growth speed of calcite type single crystal also becomes lower and a great quantity of aqueous ammonia is required, thereby increasing the manufacturing cost.

Though the temperature and pressure of this growth process are not limited to specific value, the growth rate and the quality of growth crystal are improved as the temperature is increased. When the temperature is fixed, the growth speed becomes faster but the quality becomes poor as the difference between the temperature of the growth area and that of the raw material solved area is increased. As is understood by one skilled in the art, a Teflon made inner tubular member of the autoclave can be used when the growth temperature is lower than 250° C., and heat-resistant material such as titanium is required for such an inner tubular member because the Teflon decomposes, when the growth temperature is 250° C. or higher. It is generally known that Teflon made material is less expensive and more easily manufactured than other materials.

The manufacturing method according to the present invention can produce a high quality single crystal at a high growth rate even though this reaction system is carried out under saturated vapor pressure, i.e., vapor-liquid coexistence. Therefore, this method does not need high temperature and high pressure conditions as does the conventional manufacturing methods using inorganic salt type solvent. In other words, this method does not need a specially made heat-resistant and pressure-resistant container. As a result, this allows a manufacturing plant or apparatus to be constructed at a low cost.

Referring to Table 1 attached herewith, there are shown the growth conditions and results of various embodiments according to the present invention. The growth rate of crystal ($\mu$m/day) was calculated from the difference between the weights of before and after it's growth. The transparency of the grown crystal was resulted from the observation of grown crystal by naked eyes. The results were represented by symbols ⊚ (very good), ○ (good), Δ (not good), and X (bad). The etch-pit density generated in the growth layer resulted from the following steps. The grown crystal was cloven and subjected to the etching treatment in such a manner that the cloven crystal piece was immersed in the ammonium chloride solution having a concentration of 20 wt. %, at 22° C. for 3 min. After this etching treatment, the etch pits appearing in the predetermined surface area of the cloven crystal piece were counted. Since the generation of etch pits depends on dislocation of crystal, the etch pit density per unit area, i.e., dislocation density, corresponds to the degree of defects generated in the grown crystal. (Refer to J. F. Balascio and W. B. White, Mat.Res.Bull, 7, 1461–1472, 1972.) As a reference, it is well known that a high quality of naturally produced calcite single crystal has the etch pit density of $1 \times 10^3 \sim 1 \times 10^4$ (counted number/cm$^2$).

Embodiment 1

Solvent: Ammonium Acetate (CH$_3$COONH$_4$, containing alkyl group having one carbon)

Solvent Concentration: 0.08 mole/liter

Solvent pH: 7.3

Solvent Filling Rate: 75%

Upper Temperature: 230° C. (temperature of growth area)

Lower Temperature: 242° C. (temperature of dissolution area of raw material)

Growth Period: 10 days

Since it is considerable that vapor and liquid phases were simultaneously present under the above described conditions; i.e., the temperature range between 230° C. and 242° C. and the solvent filling ratio 75%, the interior of the pressure container 1 was subjected to saturated vapor pressure. The resulting data of Embodiment 1 is shown in Table 1 in which the growth rate of seed crystal is 97 $\mu$m/day, the evaluation of transparency of the grown crystal observed by naked eyes is good, and the etch-pit density of the grown crystal is $1.2 \times 10^4$ (counted numbers/cm$^2$).

Embodiment 2

The experiment in Embodiment 2 was carried out in the similar conditions as in Embodiment 1 except that the upper temperature was 285° C., the lower temperature was 300° C., and the solvent filling rate was 65%. Since it is considerable that vapor and liquid phases were simultaneously present under the above described conditions; i.e., the temperature range between 285° C. and 300° C. and the solvent filling rate 65%, the interior of the pressure container 1 was also subjected to saturated vapor pressure. The resulting data of Embodiment 2 are shown in Table 1 in which the growth rate of seed crystal is 285 $\mu$m/day, the evaluation of transparency of the grown crystal observed by naked eyes is very good, and the etch-pit density of the grown crystal is $2.5 \times 10^3$ (counted numbers/cm$^2$). This resulting data means that Embodiment 2 is superior to Embodiment 1 with respect to the growth rate, and the evaluation of transparency and etch-pit density which indicate the quality of the grown crystal. This result arose from that the growth temperature was higher and the difference between the temperature of the growth area and that of the raw material solved area was greater than that of Embodiment 1.

Embodiment 3

The experiment in Embodiment 3 was carried out in the similar conditions as embodiment 1 except that ammonium propionate ($CH_3CH_2COONH_4$, containing alkyl group having two carbons) was used as solvent. The resulted data of Embodiment 3 are shown in Table 1 in which the growth rate of seed crystal is 124 $\mu$m/day, the evaluation of transparency of the grown crystal observed by naked eyes is good, and the etch-pit density of the grown crystal is $7.3 \times 10^3$ (counted numbers/cm$^2$). This resulting data means that Embodiment 3 is slightly improved in the growth speed and the etch-pit density in comparison with Embodiment 1.

Embodiment 4

The experiment in Embodiment 4 was carried out in similar conditions as in Embodiment 2 except that ammonium propionate was used as solvent. The resulting data in Embodiment 4 are shown in Table 1 in which the growth rate of seed crystal is 351 $\mu$m/day, the evaluation of transparency of the grown crystal observed by naked eyes is very good, and the etch-pit density of the grown crystal is $8.9 \times 10^2$ (counted numbers/cm$^2$).

Embodiment 5

The experiment in Embodiment 5 was carried out in the similar conditions as in Embodiment 1 except that ammonium butyrate [$CH_3(CH_2)_2COONH_4$, containing alkyl group having three carbons] was used as solvent. The resulting data of Embodiment 5 are shown in Table 1 in which the growth rate of seed crystal is 118 $\mu$m/day, the evaluation of transparency of the grown crystal observed by naked eyes is good, and the etch-pit density of the grown crystal is $6.4 \times 10^3$ (counted numbers/cm$^2$).

Embodiment 6

The experiment in Embodiment 6 was carried out in the similar conditions as in Embodiment 2 except that ammonium butyrate was used as solvent. The resulting data of Embodiment 6 are shown in Table 1 in which the growth rate of seed crystal is 329 $\mu$m/day, the evaluation of transparency of the grown crystal observed by naked eyes is very good, and the etch-pit density of the grown crystal is $7.1 \times 10^2$ (counted numbers/cm$^2$).

Embodiment 7

The experiment in Embodiment 7 was carried out in the similar conditions as in Embodiment 1 except that ammonium valerate [$CH_3(CH_2)_3COONH_4$, containing alkyl group having four carbons] was used as the solvent and the pH value of the solvent was prepared to 9.0. The resulting data of Embodiment 7 are shown in Table 1 in which the growth rate of seed crystal is 106 $\mu$m/day, the evaluation of transparency of the grown crystal observed by naked eyes is good, and the etch-pit density of the grown crystal is $9.8 \times 10^3$ (counted numbers/cm$^2$). This resulting data means that Embodiment 7 is equivalent to or better than Embodiment 1 with respect to the growth crystal speed and the quality of grown crystal.

Embodiments 3, 4, 5 and 6 wherein ammonium propionate or ammonium butyrate was used as the solvent indicated improvement in growth rate and crystal quality in comparison with Embodiments 1 and 2 wherein ammonium acetate was used as the solvent under the same conditions.

Referring to Table 2 attached herewith, there are shown the growth conditions and results of various comparative examples.

Comparative Example 1

Comparative Example 1 was carried out in similar conditions as in Embodiment 1 except that ammonium acetate having the concentration of 0.008 mole/liter was used as solvent. The resulting data of this comparative example 1 are shown in Table 2 in which the growth rate of seed crystal is 9 $\mu$m/day, the evaluation of transparency of the grown crystal observed by naked eyes is good, and the etch-pit density of the grown crystal is $2.9 \times 10^3$ (counted numbers/cm$^2$). As can be understood from this data, when the concentration of the solvent is less than 0.01 mole/liter, the growth speed is too slow to produce on an industrial scale even though the grown crystal has a good quality.

Comparative Example 2

Comparative Example 2 was carried out in the similar conditions as in Embodiment 1 except that ammonium acetate having the concentration of 1.5 mole/liter was used as the solvent. The resulting data of Comparative Example 2 are shown in Table 2 in which the growth rate of seed crystal is 237 $\mu$m/day, the evaluation of transparency of the grown crystal observed by naked eyes is poor, and the etch-pit density of the grown crystal is at least $1 \times 10^5$ (counted numbers/cm$^2$). Especially notable, the secondary crystal was deposited on the seed crystal, the platinum wire, and the upper portion of the container after the growth reaction. As can be understood from this data, when the concentration of the solvent is greater than 1.0 mole/liter, the quality of the grown crystal is too poor to produce on an industrial scale even though the growth speed is faster.

Comparative Example 3

Comparative Example 3 was carried out in similar conditions as in Embodiment 1 except that ammonium acetate with a pH value 6.7 was used as the solvent. The resulting data of Comparative Example 3 is shown in Table 2 in which the growth rate of seed crystal is 5 $\mu$m/day, the evaluation of transparency of the grown crystal observed by naked eyes is poor, and the etch-pit density of the grown crystal is at least $1 \times 10^5$ (counted numbers/cm$^2$). As can be understood from this data, when the pH value of the solvent is less than 7.0, the growth speed is too slow and the quality of the grown crystal is too poor to produce on an industrial scale.

Comparative Example 4

Comparative Example 4 was carried out in similar conditions as in Embodiment 1 except that ammonium nitrate was used as the solvent. The resulting data of Comparative Example 4 is shown in Table 2 in which the growth rate of the seed crystal is 21 $\mu$m/day, the evaluation of transparency of the grown crystal observed by naked eyes is not good, and the etch-pit density of the grown crystal is 4.9×10⁴ (counted numbers/cm²). Especially notable, the secondary crystal was deposited on the seed crystal, the platinum wire, and the upper portion of the container after the growth reaction.

Comparative Example 5

Comparative Example 5 was carried out in similar conditions as in Embodiment 1 except that ammonium chloride was used as the solvent. The resulting data of Comparative Example 5 is shown in Table 2 in which the growth rate the of seed crystal is 33 $\mu$m/day, the evaluation of transparency of the grown crystal observed by naked eyes is not good, and the etch-pit density of the grown crystal is 6.6×10⁴ (counted numbers/cm²). Especially notable, the secondary crystal was deposited on the seed crystal, the platinum wire, and the upper portion of the container after the growth reaction.

As can be understood from the above described Embodiments 1, 3, 5 and 7, and Comparative Examples 4 and 5, the cases using the conventional inorganic salt solvents resulted in slower growth speed and poorer quality in comparison with the cases according to the present invention.

It can be confirmed that the method for producing calcite-type calcium carbonate single crystal according to the present invention using ammonium salts of mono-carboxylic acids provides an industrially appropriate growth rate and quality of calcite-type calcium carbonate single crystal in comparison with conventional methods using inorganic salt type solvents under the same growth conditions.

There is no remarkable difference between conventional inorganic salt type solvents and the ammonium salts of mono-carboxylic acid used in the present invention with respect to the solubility of calcite. According to this fact, it is considerable that the growth speed depends on the difference in the interaction between the solvent and the ion species dissolved out of the calcium carbonate raw material. In other words, it can be anticipated that the ion species generated from the calcite-type calcium carbonate by the solvent interacts with the solvent itself to form its salvation in a specific complex form and then the ion species desolvates over the surface of seed crystal. Since the solvents used in the present invention are remarkably easy in desolvating the ion species than conventional inorganic salt type solvents, the growth rate of calcite-type calcium carbonate single crystal may be accelerated.

The method according to the present invention can realize the growth of calcite-type calcium carbonate single crystal under relatively low temperature and low pressure conditions. This may allow the growth system according to the present invention, freedom from an expensive high pressure resistant container. This will reduce the manufacturing cost if the method according to the present invention will be carried out on an industrial scale. In addition to this merit, the method according to the present invention can produce the calcite-type calcium carbonate single crystal having a quality equivalent to, or superior to, naturally produced calcite single crystal. It is needless to say that the calcite-type calcium carbonate single crystal produced by this invention can be advantageously used for various optical elements.

As many apparently widely different embodiments of this invention may be made without departing from the spirit and scope thereof, it is to be understood that the invention is not limited to the specific embodiment thereof as defined in the appended claims.

TABLE 1

| | | Embodiment | 1 | 2 | 3 | 4 |
|---|---|---|---|---|---|---|
| Growth Conditions | Solvent | | Ammonium Acetate | Ammonium Acetate | Ammonium Propianate | Ammonium Propionate |
| | Chemical Formula | | $CH_3COONH_4$ | $CH_3COONH_4$ | $CH_3CH_2COONH_4$ | $CH_3CH_2COONH_4$ |
| | Solvent Concentration (mole/l) | | 0.08 | 0.08 | 0.08 | 0.08 |
| | Solvent pH | | 1.3 | 1.3 | 7.3 | 1.3 |
| | Solvent Filling Ratio (%) | | 75 | 65 | 75 | 65 |
| | Upper Temp (° C.) | | 230 | 285 | 230 | 285 |
| | Lower Temp (° C.) | | 242 | 300 | 242 | 300 |
| | Growth Period (Days) | | 10 | 10 | 10 | 10 |
| Results | Growth Rate ($\mu$m/day) | | 97 | 285 | 124 | 351 |
| | Transmissivity | | ◯ | ⊚ | ◯ | ⊚ |
| | Etch-Pit Density (Counted Number/cm²) | | $1.2 \times 10^4$ | $2.5 \times 10^3$ | $1.3 \times 10^3$ | $8.9 \times 10^2$ |

| | | Embodiment | 5 | 6 | 7 |
|---|---|---|---|---|---|
| Growth Conditions | Solvent | | Ammonium Butyrate | Ammonium Butyrate | Ammonium Valerate |
| | Chemical Formula | | $CH_3(CH_2)_2COONH_4$ | $CH_3(CH_2)_2COONH_4$ | $CH_3(CH_2)_3COONH_4$ |
| | Solvent Concentration (mole/l) | | 0.08 | 0.08 | 0.08 |
| | Solvent pH | | 7.3 | 1.3 | 9.0 |
| | Solvent Filling Ratio (%) | | 75 | 65 | 75 |
| | Upper Temp (° C.) | | 230 | 285 | 230 |

TABLE 1-continued

| | | | | |
|---|---|---|---|---|
| | Lower Temp (° C.) | 242 | 300 | 242 |
| | Growth Period (Days) | 10 | 10 | 10 |
| Results | Growth Rate (μm/day) | 118 | 329 | 106 |
| | Transmissivity | ○ | ◉ | ○ |
| | Etch-Pit Density (Counted Number/cm$^2$) | 6.4 × 10$^3$ | 7.1 × 10$^2$ | 9.8 × 10$^3$ |

TABLE 2

| | Comparative Example | 1 | 2 | 3 | 4 | 5 |
|---|---|---|---|---|---|---|
| Growth Conditions | Solvent | Ammonium Acetate | Ammonium Acetate | Ammonium Acetate | Ammonium Nitrate | Ammonium Chloride |
| | Chemical Formula Solvent | CH$_3$COONH$_4$ | CH$_3$COONH$_4$ | CH$_3$COONH$_4$ | NH$_4$NO$_3$ | NH$_4$Cl |
| | Concentration (mole/l) | 0.008 | 1.5 | 0.08 | 0.08 | 0.08 |
| | Solvent pH | 7.3 | 7.3 | 6.7 | 7.3 | 7.3 |
| | Solvent Filling Ratio (%) | 75 | 75 | 75 | 75 | |
| | Upper Temp (° C.) | 230 | 230 | 230 | 230 | 230 |
| | Lower Temp (° C.) | 242 | 242 | 242 | 242 | 242 |
| | Growth Period (Days) | 10 | 10 | 10 | 10 | 10 |
| Results | Growth Rate (μm/day) | 9 | 237 | 5 | 21 | 33 |
| | Transmissivity | ○ | X | X | Δ | Δ |
| | Etch-Pit Density (counted Number/cm$^2$) | 2.9 × 10$^3$ | 10$^5$ at least | 10$^5$ at least | 4.9 × 10$^4$ | 6.6 × 10$^4$ |

What is claimed is:

1. A method for producing calcite-type carbonate single crystal, the method comprising the steps of:

a) providing a pressure and heat resistant container;

b) arranging in the container a starting material which comprises calcium carbonate;

c) adding to the container an effective amount of solvent, the solvent is an aqueous solution of at least one ammonium salt of mono-carboxylic acids chosen from propionic acid, butyric acid and valeric acid, the mono-carboxylic acids containing an alkyl group having from about two to about four carbons;

d) providing a seed crystal in an upper portion of the container;

e) sealing the container;

f) controlling the temperature in the container sufficient to initiate hydrothermal synthesis of at least one calcite-type carbonate crystal and generate a temperature gradient between a lower portion of the container and the upper portion; and g) maintaining hydrothermal synthesis in the container for a period of time sufficient to crystallize the at least one calcite-type calcium carbonate single crystal on the suspended seed crystal and grow the at least one crystal to a desired crystal lattice.

2. The method of claim 1 and further including the step of:

a) adjusting the concentration of the solvent prior to adding to the container, the adjusted concentration being from about 0.01 to about 1 mole/liter.

3. The method of claim 1 and further including the step of:

a) adjusting the pH value of the solvent prior to adding to the container, the adjusted pH being from about 7.0 to about 10.5.

4. The method of claim 1 and wherein:

a) controlling the temperature to maintain the temperature of the upper portion at about 285° C. and of the lower portion at about 300° C. whereby a temperature gradient is generated between a crystal growth area in the upper portion and a dissolution area in the lower portion.

* * * * *